(12) United States Patent
Chen et al.

(10) Patent No.: US 10,340,922 B1
(45) Date of Patent: Jul. 2, 2019

(54) BIAS CIRCUIT FOR TEMPERATURE-COMPENSATED VARACTOR

(71) Applicant: QUALCOMM Incorporated, San Diego, CA (US)

(72) Inventors: Luis Chen, Chula Vista, CA (US); Jeffrey Mark Hinrichs, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/947,738

(22) Filed: Apr. 6, 2018

(51) Int. Cl.
  *H03L 1/02* (2006.01)
  *H03L 7/099* (2006.01)
  *H03B 5/04* (2006.01)
  *H03B 5/12* (2006.01)

(52) U.S. Cl.
  CPC .............. *H03L 1/023* (2013.01); *H03B 5/04* (2013.01); *H03B 5/1215* (2013.01); *H03B 5/1228* (2013.01); *H03B 5/1231* (2013.01); *H03B 5/1243* (2013.01); *H03B 5/1253* (2013.01); *H03B 5/1265* (2013.01); *H03B 5/1293* (2013.01); *H03L 7/099* (2013.01)

(58) Field of Classification Search
  USPC ........................................................ 331/176
  See application file for complete search history.

(56) References Cited

U.S. PATENT DOCUMENTS

| 7,167,058 | B2 | 1/2007 | Meltzer |
| 8,289,094 | B2 | 10/2012 | Wennekers et al. |
| 9,438,249 | B1 | 9/2016 | Nguyen et al. |
| 2003/0227792 | A1* | 12/2003 | Marr ....................... G11C 11/39 365/154 |
| 2009/0033428 | A1 | 2/2009 | Karri |
| 2015/0200217 | A1* | 7/2015 | Lin .................... H01L 27/14665 250/208.1 |
| 2016/0012867 | A1* | 1/2016 | Chhabra ................ G11C 5/148 365/226 |

FOREIGN PATENT DOCUMENTS

EP    0899866 A1    3/1999

\* cited by examiner

Primary Examiner — Joseph Chang
(74) Attorney, Agent, or Firm — Haynes and Boone, LLP

(57) ABSTRACT

A bias circuit is provided that is configure to control the bias for a diode-connected transistor operating in the sub-threshold region to produce a gate-to-source voltage. A differential tuning voltage derived from the gate-to-source voltage tunes a plurality of varactors.

20 Claims, 3 Drawing Sheets

BIAS CIRCUIT FOR TEMPERATURE-COMPENSATED VARACTOR

TECHNICAL FIELD

This application relates to varactors, and more particularly to a bias circuit for biasing a temperature-compensated varactor.

BACKGROUND

Tunable circuits such as a voltage-controlled oscillator (VCO) in a phase-locked loop (PLL) often obtain their tuning using the variable capacitance from a varactor. The variation of a tuning voltage for the varactor varies its capacitance. For example, the feedback within a PLL adjusts the tuning voltage for the varactor (or varactors) so that the desired output frequency is produced by the VCO. Ideally, a fixed tuning voltage produces a fixed capacitance for the varactor to operate the varactor in a high gain region of its tuning curve. But even with a fixed tuning voltage, the capacitance for a varactor will increase with temperature so as to have a proportional-to-absolute-temperature (PTAT) profile. This increase in capacitance forces the VCO to have an output frequency that is lower than what was desired. An example error for the VCO frequency would be −700 KHz per degree Celsius. The temperature-induced increase in varactor capacitance can thus push the VCO frequency off from the desired output frequency by 100 MHz or more depending upon the temperature increase or decrease.

Given the varactor's temperature sensitivity, is thus conventional to compensate the tuning voltage for a varactor to reduce its temperature sensitivity. But prior art temperature compensation schemes have proven to be problematic. For example, it is conventional for a bias circuit to use the threshold voltage of a bipolar junction transistor (BJT) to provide the tuning voltage for a varactor. The threshold voltage has a complementary-to-absolute-temperature (CTAT) profile so the tuning voltage is reduced as the temperature increases to offset the varactor's PTAT capacitance behavior. But the threshold voltage for a BJT is process independent. As the power supply voltage in modern designs has dropped (e.g., to 675 mV), it becomes difficult to design a BJT-based bias circuit for a varactor since the threshold voltage of a BJT is typically around 700 mV. To lower the BJT threshold voltage for such reduced power supply voltage bias circuits requires the BJT size to be increased dramatically, which lowers density for the bias circuit. In addition, the sensitivity to ground bounce is also more pronounced as the power supply voltage is reduced.

To increase density at lower supply voltages, a current-source-based bias circuit has been developed in which the tuning voltage for a negative terminal of the varactor is developed by a difference current equaling the difference between a current from a PTAT current source and a temperature-constant current from a bandgap current source. As the temperature increases, the tuning voltage reduces to compensate the temperature drift that would otherwise occur for the varactor. But the matching of the current sources is difficult and adds to design complexity and cost.

Accordingly, there is a need in the art for improved varactor temperature compensation, particularly at low power supply voltages.

SUMMARY

A bias circuit is provided that includes a diode-connected metal-oxide semiconductor field effect transistor (MOS-FET). A switched-capacitor common-mode feedback circuit controls a bias of the diode-connected MOSFET to produce a differential voltage having a desired common-mode voltage. In particular, the differential voltage is derived from the gate-to-source voltage of the diode-connected transistor. The differential voltage biases one or more varactors so that a capacitance for the varactors is substantially temperature compensated. Advantageously, a power supply voltage for the bias circuit may be relatively low without requiring a relatively large size for the diode-connected MOSFET.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A bias circuit is provided that uses the gate-to-source voltage for a diode-connected metal-oxide semiconductor field effect transistor (MOSFET) to generate the tuning voltage for a varactor. Unlike a BJT-based bias circuit, the gate-to-source voltage for a diode-connected MOSFET scales as the power supply is reduced without requiring dramatic increases in the MOSFET size. Density is thus preserved while power consumption is reduced through the reduced power supply voltage for the bias circuit. The diode-connected MOSFET can be either an n-type MOSFET (NMOS) or a p-type MOSFET (PMOS). An example PMOS implementation for a bias circuit will be discussed first followed by a discussion of an NMOS implementation.

Figure 1A:
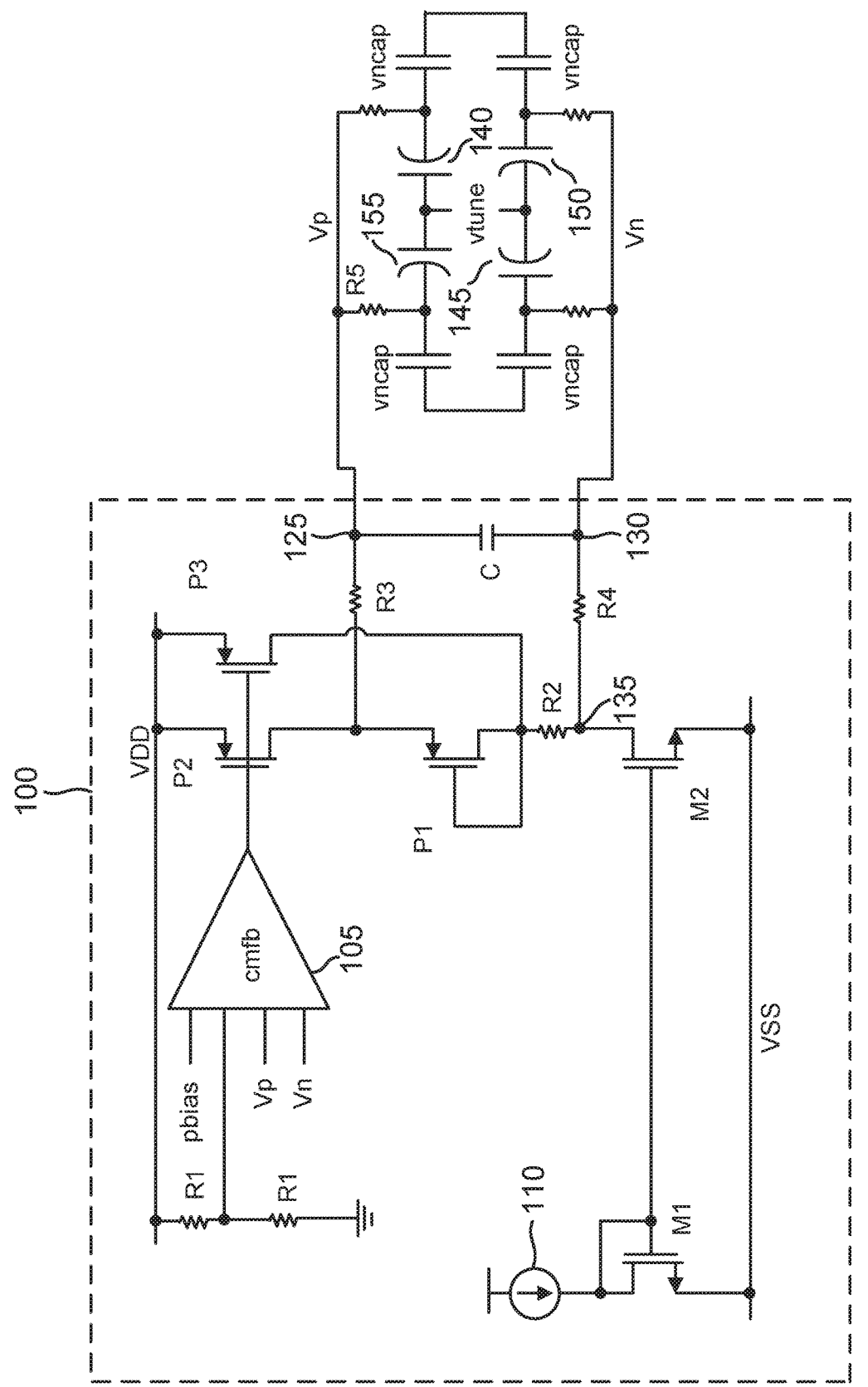
FIG. 1A illustrates a PMOS-based bias circuit biasing a plurality of varactors in accordance with an aspect of the invention.

An example bias circuit 100 is shown in FIG. 1A that includes a PMOS diode-connected transistor P1. A complementary-to-absolute temperature (CTAT) dependency for a gate-to-source voltage (Vgs) of transistor P1 is enhanced if transistor P1 is biased to operate in the sub-threshold region. A differential voltage is derived from a gate-to-source voltage for transistor P1 to bias a varactor. The differential voltage equals a difference between a differential tuning voltage Vp and a differential tuning voltage Vn as will be discussed further herein. Feedback from a switched-capacitor common-mode feedback (CMFB) circuit 105 keeps the common-mode voltage for the differential tuning voltages Vp and Vn at a desired level such as one-half of a power supply voltage VDD. But the gate-to-source voltage for transistor P1 when operated in the sub-threshold region is rather small. The tuning voltage Vp is derived from the source of transistor P1. To assist the control of the common-mode voltage by CMFB circuit 105, the tuning voltage Vn is not derived from a drain of transistor P1 but instead from a node 135 that connects to the drain of transistor P1 through a resistor R2. In this fashion, an ohmic drop across the resistor R2 increases the difference between voltages Vp and voltage Vn as compared to the differential voltage merely equaling the gate-to-source voltage for transistor P1.

To filter low-frequency noise, a node 125 carrying voltage Vp and a node 130 for carrying voltage Vn are coupled together through a capacitor C. Node 125 connects to the source of source of transistor P1 through a filtering resistor R3 that functions to reduce high-frequency noise from bias circuit 100 from affecting the voltage Vp. Similarly, node 130 connects to node 135 through a filtering resistor R4 for producing voltage Vn. In one implementation, resistor R3, resistor R4, and resistor R2 may be deemed to comprise a means for producing a differential voltage from a drain-to-source voltage for the diode-connected transistor P1.

An NMOS current source transistor M2 in a current mirror configuration with an NMOS transistor M1 produces a bias current that is split into the sub-threshold current conducted through transistor P1. In particular, a current source 110 drives a bias current into a drain of transistor M1 that is diode-connected so that its drain and gate are coupled together. The sources of transistors M1 and M2 are tied to ground (VS S). The gate of transistor M1 is connected to the gate of transistor M2. Transistor M2 will thus conduct a mirrored version of the current from current source 110 (the proportionality of this mirrored current depends upon the size ratio between transistors M1 and M2). As discussed above, it is desirable that transistor P1 operate in the subthreshold region. Thus, only a sub-threshold current portion of the mirrored current is conducted through transistor P1. In particular, the drain of transistor P1 couples to a power supply node supplying the power supply voltage VDD through a PMOS transistor P3. Similarly, the source of transistor P1 couples to the power supply node through a PMOS transistor P2. Transistors P1 and P2 thus form a current path that is in parallel with transistor P3. In particular, the sources for transistors P2 and P3 are tied to the power supply node. The drain of transistor P2 connects to the source of transistor P1 whereas the drain of transistor P3 connects to the drain of transistor P1. In one implementation, transistors M1, M2, P2 and P3 comprise a means for driving a sub-threshold current through the diode-connected transistor P1.

Since the gates of transistors P2 and P3 are both biased by the output voltage from CMFB 105, the mirrored current from transistor M2 will thus be split between transistors P2 and P3. If transistors P2 and P3 were the same size, the current would be split equally. But transistor P3 is larger than transistor P2—for example, transistor P3 may be fifteen times larger than transistor P2. The bulk of the current conducted by transistor M2 will thus not flow through transistors P1 and P2 but instead through transistor P3. In this fashion, transistor P1 may be biased to conduct a sub-threshold level of current without requiring transistor M2 to conduct such a small amount of current.

Although the total amount of current conducted by transistors P1 and P3 is a constant, note that CMFB 105 is biasing transistors P2 and P3 so that the common-mode voltage for the differential bias voltages Vp and Vn equals a desired value such as VDD/2. The desired value for the common-mode voltage is also referred to herein as a reference voltage. Should the common-mode voltage be too low, the feedback through CMFB 105 will lower the gate voltages for transistors P2 and P3 to conduct more current. But because the total current conducted by transistors P1 and P3 is choked by transistor M2, the result of this feedback is to accumulate charge on the source of transistor P1 and thus increase Vp with respect to Vn. Conversely, CMFB 105 increase the gate voltages for transistors P2 and P3 so that charge is reduced at the source of transistor to lower voltage Vp should the common mode voltage be too low.

The nominal or default bias of transistor P2 and P3 by CMFB 105 may bias these transistors so that they conduct in total the same current as conducted by transistor M2. CMFB 105 thus receives a nominal bias voltage pbias that sets this nominal bias for transistors P2 and P3. Depending upon whether the common-mode voltage is too high or too low, the feedback through CMFB 105 will either increase the gate voltages for transistors P2 and P3 or decrease these gate voltages sufficiently with respect to the nominal bias voltage pbias to keep the common-mode voltage equaling the desired common-mode voltage. It is convenient with respect to maximizing head room (and tail room with respect to ground) for the common-mode voltage if the desired common-mode voltage equals VDD/2. Thus, a voltage divider formed by a serial combination of a pair of resistors R1 divides VDD to produce the desired common-mode voltage VDD/2 as an input to CMFB 105. CMFB 105 then functions to determine the error between the common-mode voltage and the desired common-mode voltage. CMFB 105 thus receives differential bias voltages Vp and Vn so that it can determine this error and adjust its output voltage accordingly.

Bias circuit 100 biases a plurality of varactors using the differential bias voltages Vp and Vn. But it will be appreciated that voltage Vp may be used in a single-ended fashion to bias a varactor in alternative embodiments. Voltage Vp biases the negative terminal for a varactor 155 and a varactor 140. Conversely, voltage Vn biases the positive terminal for a varactor 145 and a varactor 150. This biasing of the varactor terminals occurs through resistors R5 to reduce feedback from the varactors to bias circuit 100. A differential tuning voltage Vtune is produced across a node between varactors 155 and 140 and another node between varactors 145 and 150. Should there be common-mode noise such as a sudden increase in the common-mode voltage, the differential biasing of the varactors by differential bias voltages Vp and Vn reduces the effect on the resulting varactor capacitance. Similarly, ground bounce is also substantially prevented from affecting the tuning voltage Vtune through the differential drive of the varactors. To provide additional impedance adjusting, the negative terminal for varactor 155 couples to the positive terminal of varactor 145 through a pair of metal-layer capacitors vncap. Similarly, the negative terminal of varactor 140 couples to the positive terminal of varactor 150 through another pair of metal-layer capacitors vncap. It will be appreciated that capacitors vncap may be omitted in alternative implementations.

Figure 1B:
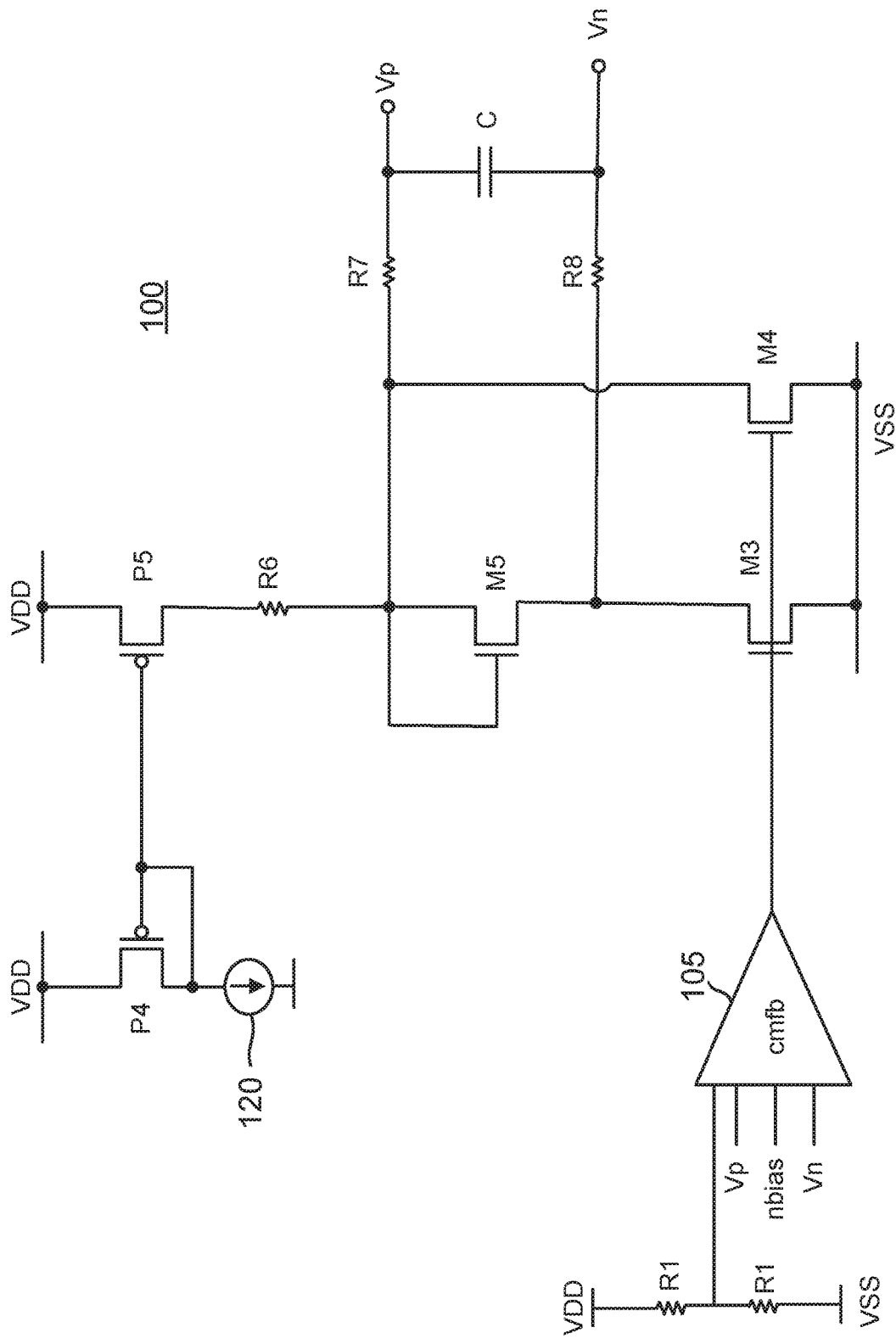
FIG. 1B illustrates an NMOS biased bias circuit for biasing a plurality of varactors in accordance with an aspect of the invention.

Note the advantages of bias circuit 100—the power supply voltage VDD may be reduced to relatively low levels (e.g., 675 millivolts) yet transistor P1 need not be massively sized to produce a gate-to-source voltage that keeps the varactor capacitance substantially constant over temperature. Such an advantageous result may also be achieved in an NMOS implementation as shown for another implementation of bias circuit 100 in FIG. 1B. In this implementation, the differential bias voltage Vp and Vn are derived from the gate-to-source voltage of a diode-connected NMOS transistor M5. A PMOS transistor P5 is in a current mirror configuration with another PMOS transistor P4 having its drain coupled to ground through a current source 120. The drain and gate of transistor P4 are connected to the gate of transistor P5. Both the sources of transistor P4 and P5 are tied to the power supply voltage node for the power supply voltage VDD. The current from current source 120 will thus be mirrored through transistor P5 (in a proportionality depending upon the size ratio between transistors P4 and P5).

To keep transistor M5 in the subthreshold region, the current from transistor P5 is split between a pair of NMOS transistors M3 and M4 that both have their sources coupled to ground. A CMFB circuit 105 drives the gates of transistors M3 and M4 with a nominal bias voltage nbias. Transistor M4 is larger than transistor M3 (for example, fifteen times larger) so that the bulk of the bias current from transistor P5 conducts through transistor M4, which has its drain tied to the drain of transistor M5. The drain of transistor M3 couples to the drain of transistor P5 through transistor M5. CMFB circuit 105 receives differential bias voltages Vp and Vn so that an error between the common-mode voltage for differential bias voltages Vp and Vn and a desired common-mode voltage may be determined. For example, the voltage divider formed by resistors R1 may divide the power supply voltage VDD by one-half to produce the desired common-mode voltage received by CMFB 105 as discussed with regard to FIG. 1A. It will be appreciated that other values for the desired common-mode voltage may be used but VDD/2 provides the optimum value for the common-mode voltage with respect to its separation from ground and VDD. A resistor R6 connected between the drain of transistor M5 and the drain of transistor P5 provides the additional ohmic drop between voltage Vp and voltage Vn in an analogous fashion as discussed with regard to resistor R2 of FIG. 1A. In particular, the gate-to-source voltage for transistor M5 is relatively small when it is biased to operate in the sub-threshold region. Since the drain of transistor M4 connects to the drain of transistor M5 that in turn connects to resistor R6, resistor R6 conducts the full bias current from transistor P5 and thus provides the ohmic drop to push voltages Vp and Vn apart from each other so that the control of the common-mode voltage is eased. Voltage Vn is produced through a resistor R8 that connects to the source of transistor M5. Voltage Vp is produced through a resistor R7 that connects to a node between resistor R6 and the drain of transistor P5. Resistors R7 and R8 are analogous to resistors R3 and R4 of FIG. 1A and provide analogous filtering of high-frequency noise. Similarly, a capacitor C filters the low-frequency noise from the differential bias voltages Vp and Vn.

Figure 2:
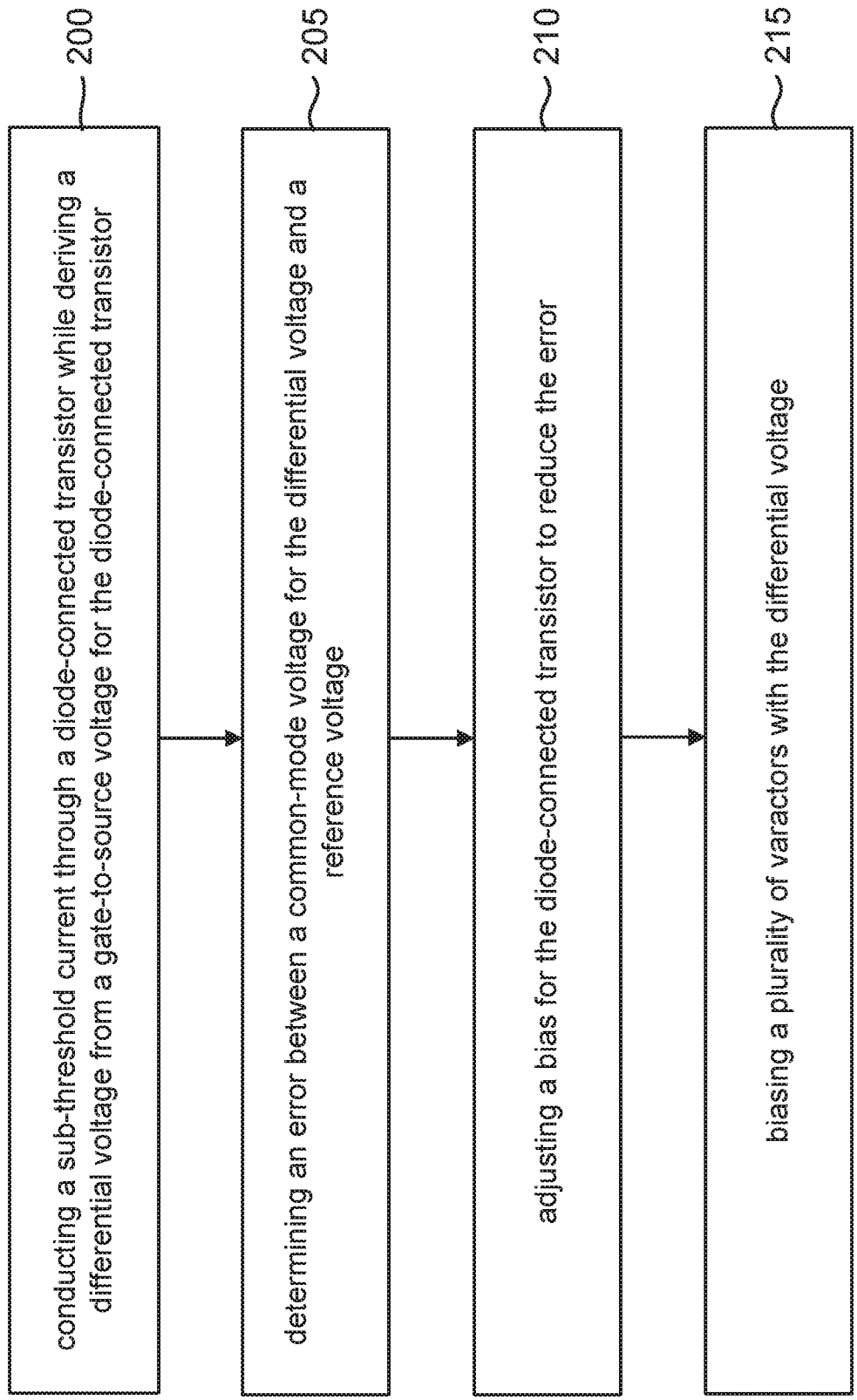
FIG. 2 is a flow chart for a method of generating a tuning voltage for biasing a varactor in accordance with an aspect of the invention.

One implementation of a method will now be discussed for a method of biasing a plurality of varactors with regard to the flowchart shown in FIG. 2. The method includes an act 200 of conducting a sub-threshold current through a diode-connected transistor while deriving a differential voltage from a gate-to-source voltage for the diode-connected transistor The sub-threshold current conducted through either of transistors P1 and M5 while the differential bias voltages Vp and Vn are produced is an example of act 200. The method further includes an act 205 of determining an error between a common-mode voltage for the differential voltage and a desired common-mode voltage. The calculation of the common-mode voltage error in CMFB 105 is an example of act 205. The method also includes an act 210 of adjusting a bias for the diode-connected transistor to reduce the error. The feedback through CMFB 105 that controls the differential voltage so that the common-mode voltage equals the desired common-mode voltage is an example of act 210. Finally, the method includes an act 215 of biasing a plurality of varactors with the differential voltage. The biasing of the varactors discussed with regard to FIG. 1A is an example of act 215.

It will be appreciated that many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:
1. A bias circuit, comprising:
a diode-connected transistor;
a first transistor coupled in series with the diode-connected transistor;
a first output terminal for tuning a varactor, the first output terminal coupled to the source of the diode-connected transistor;
a resistor coupled in series with the diode-connected transistor;
a second output terminal for tuning the varactor, the second output terminal coupled to a first terminal of the resistor; and
a common-mode feedback circuit configured to control an output voltage biasing a gate of the first transistor so that a common-mode voltage for a differential voltage across the first output terminal and the second output terminal equals a reference voltage.

2. The bias circuit of claim 1, further comprising:
a voltage divider for dividing a power supply voltage to produce the reference voltage, wherein the common-mode feedback circuit is configured to determine an error between the reference voltage and the common-mode voltage for the differential voltage and to control the output voltage responsive to the error.

3. The bias circuit of claim 2, wherein the common-mode feedback circuit is further configured to receive a bias voltage and to control the output voltage so that it equals the bias voltage when the error is zero.

4. The bias circuit of claim 1, wherein the varactor comprises a plurality of varactors, and wherein bias circuit is configured so that the differential voltage biases the plurality of varactors.

5. The bias circuit of claim 4, wherein the plurality of varactors comprises a first set of varactors and a second set of varactors, and wherein the bias circuit is further configured so that the differential voltage is applied across a positive terminal for each varactor in the first set of varactors and a negative terminal for each varactor in the second set of varactors.

6. The bias circuit of claim 1, wherein the diode-connected transistor is an n-type metal oxide semiconductor (NMOS) transistor.

7. The bias circuit of claim 1, wherein the diode-connected transistor is an p-type metal oxide semiconductor (PMOS) transistor.

8. The bias circuit of claim 1, further comprising:
a second transistor arranged in parallel with the diode-connected transistor and the first transistor, the second transistor having a terminal connected to a second terminal for the resistor, wherein a size for the second transistor is greater than a size for the first transistor.

9. The bias circuit of claim 8, wherein a drain for the diode-connected transistor is connected to the first terminal of the resistor and a source for the diode-connected transistor wherein the second terminal for the diode-connected transistor is connected to a drain of the first transistor.

10. The bias circuit of claim 8, further comprising a current mirror configured to produce a current that is split between the diode-connected transistor and the second transistor.

11. A method, comprising:
conducting a sub-threshold current through a diode-connected transistor while deriving a differential voltage from a gate-to-source voltage for the diode-connected transistor;
determining an error between a common-mode voltage for the differential voltage and a reference voltage;
adjusting a bias for the diode-connected transistor to reduce the error; and
biasing a plurality of varactors with the differential voltage.

12. The method of claim 11, wherein conducting the sub-threshold current through the diode-connected transistor comprises
generating a bias current; and
splitting the bias current between the diode-connected transistor and a second transistor so that the second transistor conducts a bulk of the bias current and the diode-connected transistor conducts the sub-threshold current.

13. The method of claim 12, wherein adjusting the bias for the diode-connected transistor comprises:
adjusting a gate voltage for a third transistor in series with the diode-connected transistor and a gate voltage for the second transistor to reduce the error.

14. The method of claim 11, further comprising generating the reference voltage by dividing a power supply voltage.

15. The method of claim 11, wherein the plurality of varactors comprises a first set of varactors and a second set of varactors, and wherein biasing the plurality of varactors with the differential voltage comprises applying the differential voltage across a positive terminal for each varactor in the first set of varactors and a negative terminal for each varactor in the second set of varactors.

16. A bias circuit, comprising:
a diode-connected transistor;
means for driving a sub-threshold current through the diode-connected transistor;
means for producing a differential voltage from a drain-to-source voltage for the diode-connected transistor; and
a common-mode feedback circuit configured to control a bias for the diode-connected transistor so that a common-mode voltage for the differential voltage equals a reference voltage.

17. The bias circuit of claim 16, wherein the common-mode feedback circuit comprises a switched-capacitor common-mode feedback circuit.

18. The bias circuit of claim 16, wherein the diode-connected transistor is an n-type metal oxide semiconductor (NMOS) transistor.

19. The bias circuit of claim 16, wherein the diode-connected transistor is an p-type metal oxide semiconductor (PMOS) transistor.

20. The bias circuit of claim 16, further comprising means for biasing a plurality of varactors with the differential bias voltage.

* * * * *